(12) United States Patent
Kishiro

(10) Patent No.: US 7,172,942 B2
(45) Date of Patent: Feb. 6, 2007

(54) METHOD FOR MANUFACTURING SEMICONDUCTOR ELEMENTAL DEVICE

(75) Inventor: Koichi Kishiro, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/349,232

(22) Filed: Feb. 8, 2006

(65) Prior Publication Data

US 2006/0177984 A1    Aug. 10, 2006

(30) Foreign Application Priority Data

Feb. 8, 2005    (JP)    ............................. 2005-032022

(51) Int. Cl.
*H01L 21/336*    (2006.01)
(52) U.S. Cl. ...................... 438/287; 438/289; 438/981; 257/E21.675
(58) Field of Classification Search ................ 438/276, 438/287, 289, 305–308, 981
See application file for complete search history.

(56) References Cited

U.S. PATENT DOCUMENTS 6,300,197 B1    10/2001    Inaba 6,562,729 B2 *    5/2003    Kamath et al.    ............. 438/769

FOREIGN PATENT DOCUMENTS

JP    A-07-094503    4/1995

* cited by examiner

*Primary Examiner*—H. Jey Tsai
(74) *Attorney, Agent, or Firm*—Volentine Francos & Whitt, PLLC

(57) ABSTRACT

The present invention provides a method for manufacturing a semiconductor elemental device wherein a first gate oxide film and a second gate oxide film thicker than the first gate oxide film are formed on a substrate provided with a device forming region comprised of silicon, comprising the steps of implanting an element for promoting a forming speed of each gate oxide film into a region for forming the second gate oxide film of the substrate; and simultaneously forming the first gate oxide film and the second gate oxide film by a thermal oxidation method, wherein in the element implanting step, the element is implanted in space of a depth equal to half the thickness of the second gate oxide film placed in predetermination of its formation from the surface of the substrate in such a manner that with the peak of a concentration distribution of the element as the center, a concentration distribution in which both sides of the peak is given twice as large as a standard deviation of the concentration distribution, is taken.

4 Claims, 10 Drawing Sheets

US 7,172,942 B2

METHOD FOR MANUFACTURING SEMICONDUCTOR ELEMENTAL DEVICE

BACKGROUND OF THE INVENTION

The present invention relates to a method for manufacturing a semiconductor elemental device wherein gate oxide films different in thickness are formed in a surface layer of a silicon substrate of a semiconductor wafer comprised of the silicon substrate or a silicon substrate of a semiconductor wafer of an SOI (Silicon On Insulator) structure or an SOS (Silicon On Sapphire) structure.

As a method for forming a semiconductor element or elemental device, a suitable manufacturing method is selected depending upon the transistor characteristic of a required MOSFET (MOS (Metal Oxide Semiconductor) Field Effect Transistor). For example, a method for, when a fast operating speed is required, thinning the thickness of a gate oxide film of a MOSFET and forming a short gate length is selected, and a method for, when a high voltage is applied, thickening the thickness of a gate oxide film and forming a long gate length in order to endure its electric field is selected.

As to the gate length, if a manufacturing method capable of forming the shortest gate length formed in a semiconductor wafer is selected, there is no problem in simultaneously forming a gate length longer than it along with it. However, complex manufacturing processes are required to form gate oxide films different in thickness on one semiconductor wafer.

FIG. 7 is an explanatory view showing a general manufacturing method of gate oxide films different in thickness.

In FIG. 7, reference numeral 1 indicates a semiconductor wafer, which is a semiconductor wafer constituted of one silicon substrate 2 comprised of silicon.

As shown in FIG. 7, device isolation regions 3, a first device forming region 4a and a second device forming region 4b (called "device forming regions 4" when it is not necessary to distinguish from each other) are set to the silicon substrate 2. The device forming regions 4 are formed with an nMOS (N channel MOS) and a pMOS (P channel MOS) each corresponding to a MOSFET. A field oxide film 5 is formed in the device isolation regions 3.

The field oxide film 5 is an insulating film made up of silicon dioxide, which is formed in the device isolation regions 3 of the silicon substrate 2 by a LOCOS (Local Oxidation Of Silicon) method or an STI (Shallow Trench Isolation) method. The field oxide film 5 electrically insulates and separates between the device forming regions 4 of the silicon substrate 2. The field oxide film 5 shown in FIG. 7 is formed by dry-oxidizing silicon of the device isolation regions 3 by the LOCOS method.

Reference numerals 6 indicate gate oxide films, which are insulating films comprised of silicon dioxide formed by oxidizing a surface layer of silicon of the silicon substrate 2 in the device forming regions 4 by a thermal oxidation method. A first gate oxide film (called a thin-film gate oxide film 6a) thin in thickness is formed in the first device forming region 4a, and a second gate oxide film (called a thick-film gate oxide film 6b) thick in thickness is formed in a second device forming region 4b.

Reference numeral 10 indicates a resist mask, which is a mask member formed on the semiconductor wafer 1 by photolithography or the like. The resist mask 10 has the function of protecting regions masked upon an etching process and an ion implantation process or the like so as to be insensitive to etching and ion implantation.

The formation of gate oxide films different in thickness by a general manufacturing method will be described below in accordance with processes or process steps indicated by PZ using FIG. 7.

In PZ1, a silicon substrate 2 to which first and second device forming regions 4a and 4b and device isolation regions 3 are set, is prepared. A field oxide film 5 is formed in the device isolation regions 3 on the silicon substrate 2 by LOCOS to isolate and separate the first and second device forming regions 4a and 4b from each other respectively.

In PZ2, gate oxide films 6 of the same thickness are formed in the first and second device forming regions 4a and 4b by first thermal oxidation.

In PZ3, a resist mask 10, which covers the gate oxide film 6 in the second device forming region 4b for forming a thick-film gate oxide film 6b and the field oxide film 5 located therearound is formed by photolithography. With the resist mask 10 as a mask, the exposed gate oxide film 6 in the first device forming region 4a and the field oxide film 5 located therearound are removed by wet etching using hydrofluoric acid or the like. At this time, some of the field oxide film 5 around the first device forming region 4a is removed by etching.

In PZ4, the resist mask 10 is removed using a release agent such as acetone. Gate oxide films 6 are formed in the first and second device forming regions 4a and 4b respectively by second thermal oxidation. Thus, a thin-film gate oxide film 6a is newly formed in the first device forming region 4a from which the corresponding gate oxide film 6 is removed. The gate oxide film 6 corresponding to the second device forming region 4b is further thickened to form a thick-film gate oxide film 6b in the second device forming region 4b.

Thereafter, a predetermined impurity for adjusting the threshold voltage of each MOSFET and its rated current is implanted in a manner similar to the normal manufacturing process, after which a gate electrode is formed to form a semiconductor elemental device by a general manufacturing method.

Thus, in the general manufacturing method, process steps for thermal oxidation and oxide film removal are repeated such that a desired thickness is reached where the gate oxide films 6 different in thickness are formed on one semiconductor wafer 1.

In order to attain simplification of the process steps for the general manufacturing method, there is a need to form the gate oxide films different in thickness on one semiconductor wafer by once-thermal oxidation.

In such a case, there is known one or a means wherein a region for forming a thick-film gate oxide film on a silicon substrate formed with a field oxide film and the field oxide film on both sides thereof are covered with a resist mask, ions of nitrogen (N) corresponding to one element (oxidation inhibiting element) for inhibiting a forming speed of an oxide film are implanted at an implantation energy of 25 keV and a dose of $5 \times 10^{15}/cm^2$, a region for forming a thin-film gate oxide film and the filed oxide film on both sides thereof are covered with a resist mask again after the removal of the above resist mask, ions of Argon (Ar) corresponding to one element (oxidation promoting element) for promoting a forming speed of an oxide film are implanted at an implantation energy of 58.8 keV and a dose of $5 \times 10^{15}/cm^2$, and thermal oxidation is done at 950° C. for one hour after the removal of the resist mask to form, by once-thermal oxidation, gate oxide films different in thickness, which are 60 angstroms and 390 angstroms in thickness (refer to, for example, a patent document 1 (Japanese Unexamined Patent Publication No. Hei 7 (1995)-94503 (paragraph 0044 in page 5-paragraph 0047 in page 7 and FIG. 4).

There is also known one or a means wherein well ions are implanted in a silicon substrate formed with a field oxide film, a region for forming a thin-film gate oxide film is covered with a resist mask, ions of Argon used as an oxidation promoting element are implanted at a dose of $1\times10^{15}/cm^2$ after the implantation of channel ions such that the peak of a concentration distribution is introduced so as to be brought to the neighborhood of the surface of the silicon substrate, and thermal oxidation is carried out after the resist mask is removed and channel ions are implanted into a region for forming a thin-film gate oxide film to thereby form, by once-thermal oxidation, gate oxide films different in thickness, which are 60 angstroms and 90 angstroms in thickness (refer to, for example, Japanese Unexamined Patent Publication No. Hei 10 (1998)-335656 (paragraph 0032 in page 6—paragraph 0037 in page 7, FIG. 1 and FIG. 2)).

In the general manufacturing method referred to above, however, the field oxide films 5 uncovered with the resist mask 10 are simultaneously etched and recessioned or etched back when the wet etching is done in the process step PZ3. Hence the region in the first device forming region 4*a* substantially expands and a parasitic transistor becomes apt to turn on, for example, whereby an influence on a thin-film transistor is apt to occur. This is particularly important to the semiconductor wafer 1 of the SOI structure or the SOS structure. Since the silicon substrate 2 for forming the semiconductor elemental device is thin in such a semiconductor wafer 1, it is difficult to make the field oxide film 5 thick sufficiently. The field oxide film 5 is etched back by wet etching in the process step PZ3, so that the field oxide film 5 at the edge of the first device forming region 4*a* becomes thin. Hence, a parasitic transistor low in threshold voltage is formed at the edge so that an off leak becomes apt to increase.

Since a control or management width of an etching rate is relatively large in the wet etching, the etching rate for each semiconductor wafer 1 varies so variations in etching amount are apt to occur, thereby increasing variations in the size of the first device forming region 4*a*.

Such a problem is resolved by forming the gate oxide films different in thickness on one semiconductor wafer by once-thermal oxidation without repeating the process steps for the thermal oxidation and oxide-film removal. It is however necessary to consider the following upon implantation of the oxidation inhibiting element and the oxidation promoting element.

That is, since the implanted ions reach the surface of the silicon substrate and thereafter enter in a depth direction while their implantation energy is being lost, its concentration distribution results in a distribution configuration, i.e., a normal distribution in which as shown in FIG. 8, its concentration distribution is thin in the surface and the concentration thereof gradually increases in the depth direction and forms the peak, and thereafter the concentration decreases in the depth direction. In this case, an element for determining the distance (called diffusional intrusion length) from the surface of the silicon substrate to the peak of the concentration distribution is implantation energy. An element for determining the height of the peak of the concentration distribution is a dose.

FIG. 9 is a graph showing a diffusional intrusion length formed by implantation energy of Argon ions. It shows that the diffusional intrusion length becomes deep substantially in proportional to the implantation energy regardless of the dose.

On the surface side of the silicon substrate at the peak of the concentration distribution, the bonding of a silicon crystal is broken due to the intrusion of ions. Since the promoting action for the oxide film formation exists due to it, the forming speed of the oxide film becomes fast from the peak of the same Argon concentration as compared with the deep side.

The ion implantation has the above characteristics. Therefore, when, for example, Argon ions are used, the diffusional intrusion length becomes deep when their implantation energy is excessively increased, and the concentration of Argon in the neighborhood of the surface of the silicon substrate becomes thin, so the promoting action for oxide film formation by Argon falls and the forming speed of the oxide film becomes slow, thus resulting in the need for time upon the oxide film formation.

FIG. 10 shows the thickness of an oxide film formed by implanting Argon ions at a dose of $1\times10^{14}/cm^2$ while implantation energy of Argon ions is being changed, and thereafter performing thermal oxidation at 850° C. for 5 minutes.

In the same thermal oxidation condition as shown in FIG. 10, promoting action for oxide film formation increases until the implantation energy becomes 10 keV or so. However, the promoting action is saturated at 10 keV or so and is on the decline at 15 keV. That is, FIG. 10 shows that when the implantation energy is excessively made high, the formed oxide film becomes thin under the same thermal oxidation condition, and there is a need to prolong the time for thermal oxidation if an attempt is made to obtain the same oxide film.

Therefore, the technique of the patent document 1 is accompanied by problems that since ions of Argon used as the oxidation promoting element are implanted in high implantation energy like the implantation energy of 58.8 keV and the dose of $5\times10^{15}/cm^2$, the promoting action for the oxide film formation, of Argon in the neighborhood of the surface of the silicon substrate falls, and time is required upon formation of the oxide film if an attempt is made to obtain a predetermined film thickness.

Also, the technique is accompanied by problems that since Argon ions are implanted in high implantation energy, the diffusional intrusion length becomes deep to increase Argon ions that remain in the channel forming region, so the mobility of carriers (electrons or positive holes) in the channel forming region is reduced to thereby cause a reduction in rated current value of a transistor characteristic. Incidentally, since Argon is of an inert element, it does not exert an influence on the threshold voltage of the transistor characteristic.

The technique of the patent document 2 is accompanied by problems that since the depth of the peak is determined depending upon the implantation energy as described above because attention is focused only on the dose and ions of Argon used as the oxidation promoting element are implanted such that the peak of the concentration distribution is brought to the neighborhood of the surface of the silicon substrate, the concentration on the inner or deep side of the peak is diminished and the promoting action for oxide film formation by Argon is reduced, where the peak is excessively close to the surface, whereby time is required upon oxide film formation if an attempt is made to obtain a predetermined film thickness.

When the peak is excessively spaced away from the surface, a result similar to the patent document 1 is obtained.

SUMMARY OF THE INVENTION

The present invention has been made to solve the above problems. An object of the present invention is to provide means which, when gate oxide films different in thickness are formed on one semiconductor wafer by once-thermal oxidation, brings the thickness of each of the gate oxide films to a predetermined thickness and efficiently forms them.

According to one aspect of the present invention, for attaining the above object, there is provided a method for manufacturing a semiconductor elemental device wherein a first gate oxide film and a second gate oxide film thicker than the first gate oxide film are formed on a substrate provided with a device forming region comprised of silicon, comprising the steps of implanting an element for promoting a forming speed of each gate oxide film into a region for forming the second gate oxide film of the substrate; and simultaneously forming the first gate oxide film and the second gate oxide film by a thermal oxidation method, wherein in the element implanting step, the element is implanted in space of a depth equal to half the thickness of the second gate oxide film placed in predetermination of its formation from the surface of the substrate in such a manner that with the peak of a concentration distribution of the element as the center, a concentration distribution in which both sides of the peak is given twice as large as a standard deviation of the concentration distribution, is taken.

Thus, the present invention brings about advantageous effects in that since an oxidation promoting element is implanted in such a manner that the peak of a concentration distribution±2σ is placed in spacing of a depth equal to half an oxide film thickness placed in predetermination of its formation by implanting the oxidation promoting element into a region in which a second gate oxide film (thick-film gate oxide film) is formed, promoting action for oxide film formation by the oxidation promoting element can effectively be used, and manufacturing efficiency where gate oxide films different in thickness are formed on one semiconductor wafer by once-thermal oxidation can be enhanced and the promoting action for the formation of the oxide film by the oxidation promoting element can reliably be exhibited, thus enabling the thicknesses of the gate oxide films to be easily formed to a predetermined thickness, respectively.

Also the present invention brings about advantageous effects in that since the oxidation promoting element is implanted such that the peak of the concentration distribution±2σ is placed in the spacing of the depth equal to half the forming predeterminate oxide film thickness, the oxidation promoting element that remains in a channel forming region after the formation of the gate oxide film can greatly be reduced, and the diffusion of the oxidation promoting element into the channel forming region is suppressed, thereby making it possible to prevent a reduction in rated current value.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of a method for manufacturing a semiconductor elemental device, according to the present invention will hereinafter be described with reference to the accompanying drawings.

First Preferred Embodiment

Figure 1:
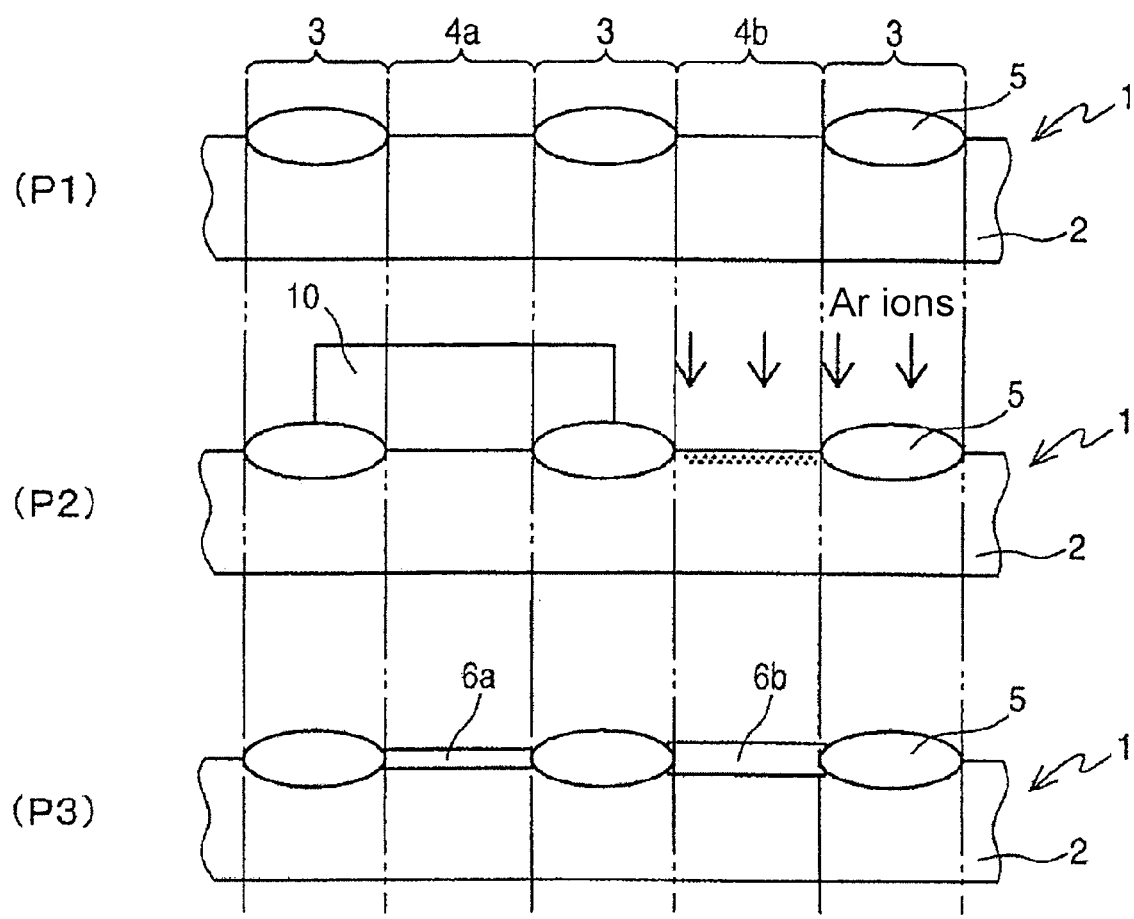
FIG. 1 is an explanatory view showing a method for manufacturing a semiconductor elemental device, according to a first embodiment.

FIG. 1 is an explanatory view showing a method for manufacturing a semiconductor elemental device, according to a first embodiment.

Figure 7:
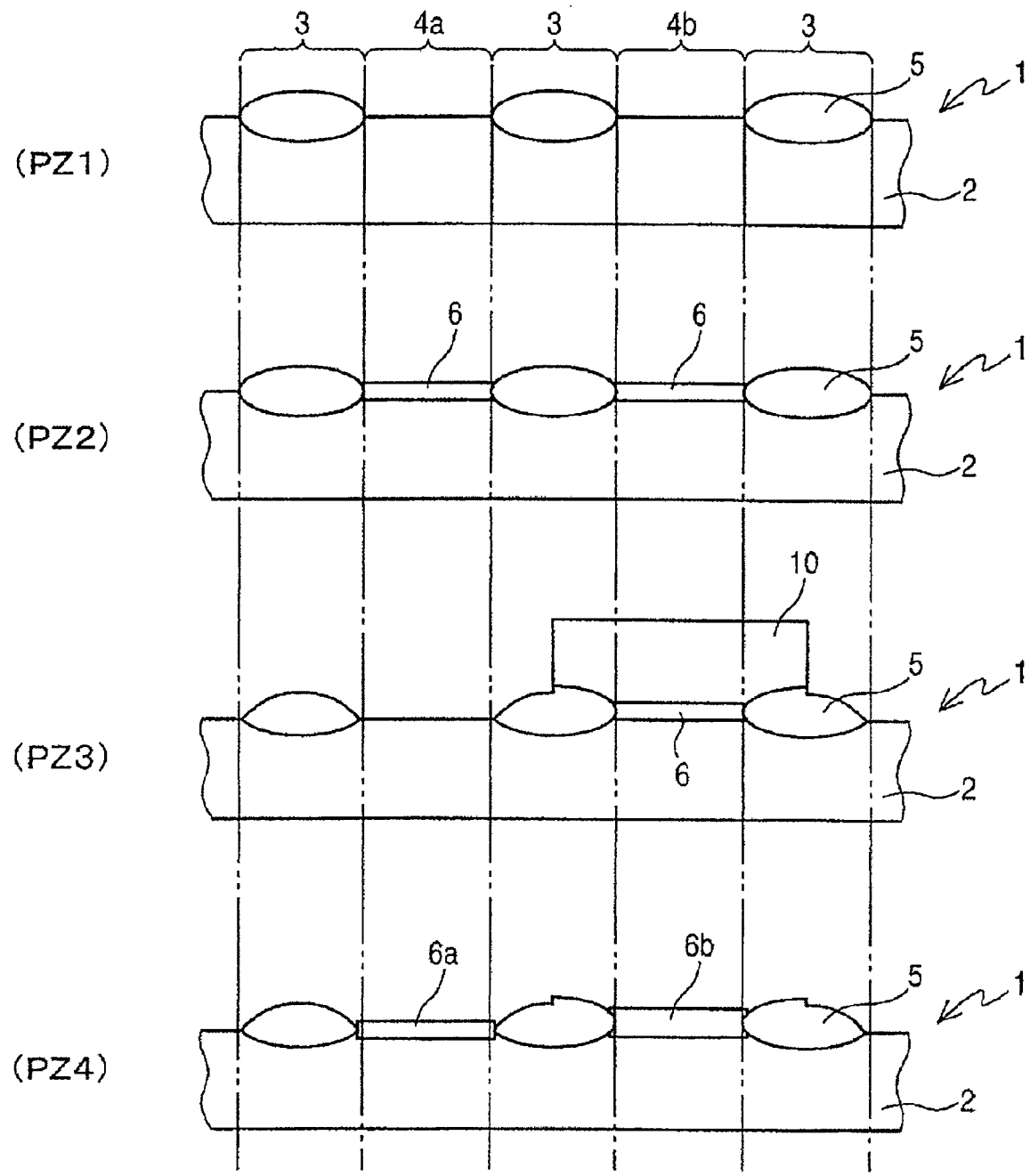
FIG. 7 is an explanatory view illustrating a general method for manufacturing gate oxide films different in thickness.
Figure 8:
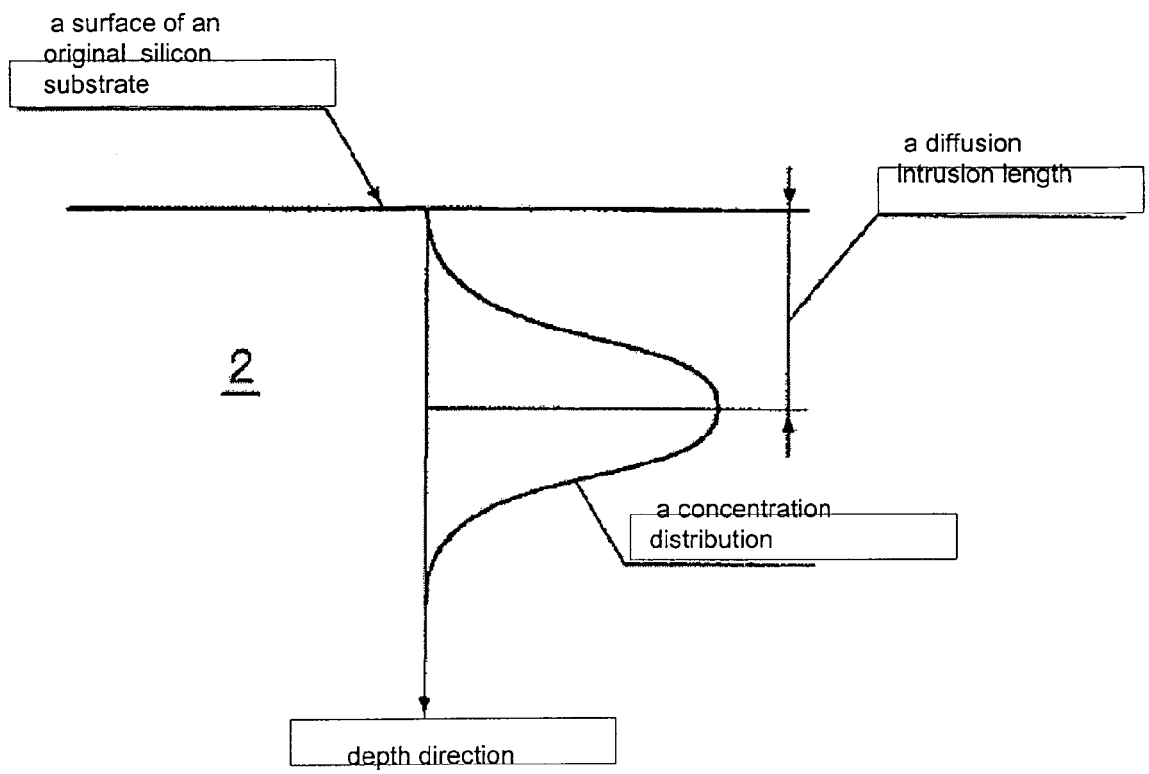
FIG. 8 is an explanatory view showing a concentration distribution of ions implanted into a surface layer of a silicon substrate.

Incidentally, constituent elements similar to those described above using FIG. 7 are given the same reference numerals and their explanations will be omitted.

A field oxide film 5 employed in the present embodiment is formed by a LOCOS method.

The method for manufacturing the semiconductor elemental device, according to the present embodiment will be described below in accordance with processes or process steps indicated by P using FIG. 1.

In P1, a field oxide film 5 is formed in a silicon substrate 2 in a manner similar to the process step PZ1 to insulate and separate first and second device forming regions 4a and 4b from each other respectively.

In P2, a resist mask 10, which covers the first device forming region 4a in which a thin-film gate oxide film 6a is formed, and the field oxide film 5 located therearound, is formed by photolithography. With the resist mask 10 as a mask, ions of Argon used as an oxidation-promoting element are implanted into the exposed second device forming region 4b as a dose of $5\times10^{14}/cm^2$ at low implantation energy like an implantation energy of 5 keV or so.

In P3, the resist mask 10 is removed using a release agent or remover. The first and second device forming regions 4a and 4b are thermally oxidized by a thermal oxidation method under conditions of 850° C. and 5 minutes to simultaneously form a thin-film gate oxide film 6a (first gate oxide film) and a thick-film gate oxide film 6b (second gate oxide film) in the first and second device forming regions 4a and 4b.

Thereafter, a predetermined impurity for adjusting the threshold voltage of each MOSFET and its rated current is implanted in a manner similar to the normal manufacturing process, after which a gate electrode is formed to form a semiconductor elemental device based on the present embodiment.

Figure 2:
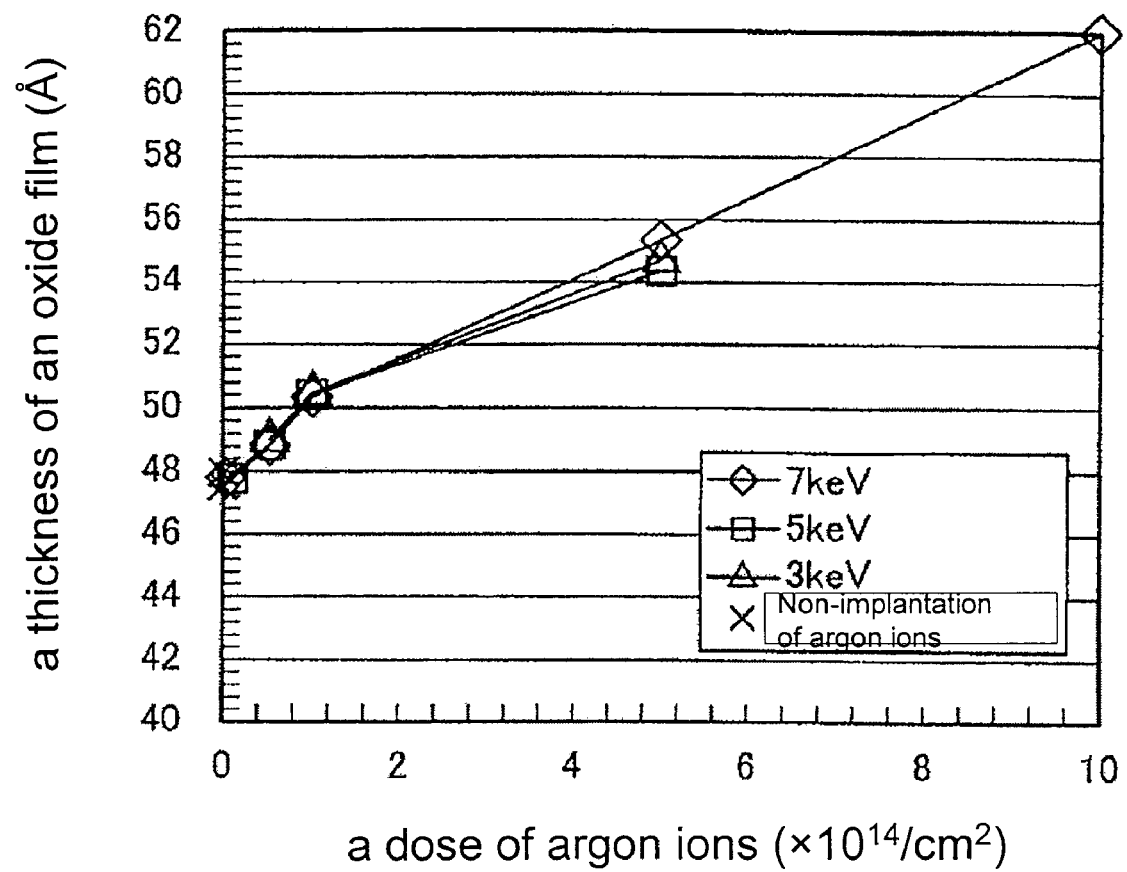
FIG. 2 is a graph illustrating changes in the thickness of a gate oxide film employed in the first embodiment depending upon doses.

As to the thicknesses of the thin-film gate oxide film 6a and thick-film gate oxide film 6b formed in the process step P3 referred to above, the thickness of the thin-film gate oxide film 6a in the first device forming region 4a with no argon ions implanted therein results in approximately 48 angstroms as indicated by a mark x in FIG. 2. Further, the thickness of the thick-film gate oxide film 6b in the second device forming region 4b with argon ions implanted therein results in about 54 angstroms as indicated by a mark □ in FIG. 2 on the above condition.

In FIG. 2, the horizontal axis indicates a dose of argon ions, and the vertical axis indicates the thickness of an oxide film formed when thermal oxidation is done at 850° C. for 5 minutes. Non-implantation of argon ions is indicated by the mark x, an implantation energy of 3 keV is indicated by marks Δ, an implantation energy of 5 keV is indicated by marks □, and an implantation energy of 7 keV is indicated by marks ◇, respectively where the implantation energy and dose are changed.

Figure 3:
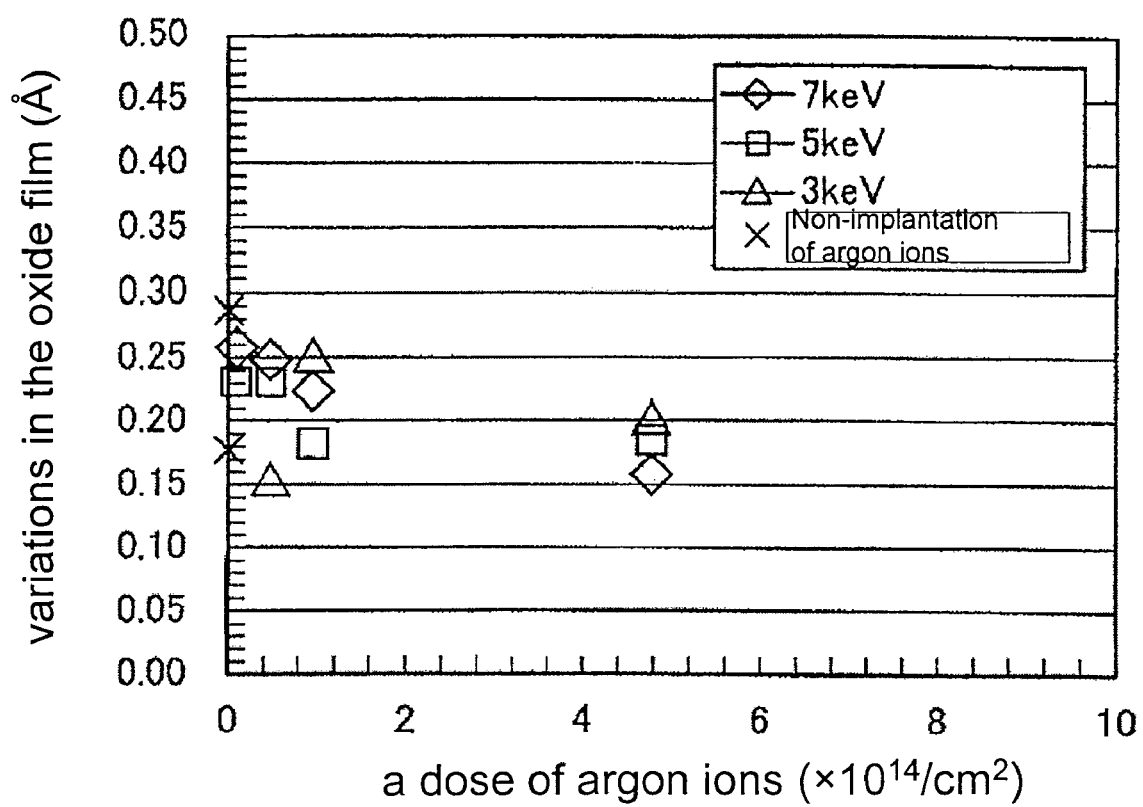
FIG. 3 is a graph showing variations in the thickness of the gate oxide film employed in the first embodiment.

FIG. 3 shows variations in the oxide film formed in FIG. 2. FIG. 3 shows the case in which variations in oxide film thickness with the implantation of argon ions become the same degree as when no argon ions are implanted.

With the implantation of argon ions into the surface of the silicon substrate 2 at the low implantation energy in this way, the corresponding thick-film gate oxide film 6b can be formed in thickness variations of the same degree as the surface of the silicon substrate 2 with no argon ions implanted therein.

Settings for forming the thick-film gate oxide film 6b in a predetermined thickness in the above case will be explained using FIG. 4.

When the specs of a semiconductor elemental device such as an LSI manufactured using a semiconductor wafer 1 are determined, the thickness of each gate oxide film 6 is determined from the characteristic of a MOSFET employed therein is determined. With the thinnest thickness of the gate oxide film 6 as the thickness of the thin-film gate oxide film 6a (first gate oxide film), a condition for thermal oxidation of the first device forming region 4a with no argon ions implanted therein is determined.

Since the predetermined thickness of the thick-film gate oxide film 6b (second gate oxide film) formed in the second device forming region 4b is determined from the characteristic of the MOSFET, the dose of argon ions is determined using a graph similar to FIG. 2 from the condition for thermal oxidation.

When the dose in this case is assumed to be $5\times10^{13}/cm^2$ or more as shown in FIG. 2, the thickness of the oxide film can be made thick. A further increase in the thickness of the oxide film can be made even by increasing a dose.

On the other hand, when silicon is oxidized, a crystal structure is changed while silicon is being bonded to oxygen, whereby silicon dioxide is formed. Since the silicon dioxide is of a crystal having a capacity equivalent to twice that of silicon, the thickness of the generated oxide film becomes a thickness equivalent to twice that of silicon. Thus, the oxide film is formed in a state of being expanded by a thickness equal to the thickness of oxidized silicon from the surface of the original silicon substrate 2 indicated by a broken line in FIG. 4.

As to the action of promoting oxide-film formation by the oxidation-promoting element such as Argon, the range of a diffusion intrusion length±2σ corresponding to twice each of standard deviations σ respectively extending to both sides (surface side and deep side) from the peak of a concentration distribution, i.e., the depth of the peak is excellent in its promoting action. Therefore, the diffusion intrusion length is determined so as to be placed inclusive of the peak of the concentration distribution±2σ between the surface of the silicon substrate 2 at the implantation of argon ions and a depth corresponding to the thickness equal to half the forming predeterminate thickness of thick-film gate oxide film 6b, i.e., between the surface of the silicon substrate 2 and a depth corresponding to half the forming predeterminate thickness of oxide film. Implantation energy of argon ions at that time is determined using FIG. 9.

If the condition for the implantation of argon ions in the above process step P2 is determined in this way, then the thick-film gate oxide film 6b can be formed to the predetermined thickness.

In the present embodiment as described above, Argon ions are implanted so as to place the peak of the concentration distribution±2σ in spacing of the depth equal to half the oxide film thickness placed in predetermination of its formation by implanting Argon ions into the second device forming region in which the thick-film gate oxide film is formed. Thus, the promoting action for the formation of the oxide film by Argon can effectively be used. It is possible to enhance manufacturing efficiency where gate oxide films different in thickness are formed on one semiconductor wafer by once-thermal oxidation. Further, the promoting action for the formation of the oxide film by Argon can be brought out reliably, and the thickness of each gate oxide film can easily be formed to the predetermined thickness.

Also Argon ions are implanted such that the peak of the concentration distribution±2σ is placed in the spacing of the depth equal to half the forming predeterminate oxide film thickness. It is therefore possible to greatly reduce Argon that remains in a channel forming region after the formation of the gate oxide film, and suppress the diffusion of Argon into the channel forming region thereby to prevent a reduction in rated current value.

Further, Argon ions are implanted in the surface of the silicon substrate at low implantation energy like 3 keV or higher and 10 keV or lower. It is thus possible to form the thick-film gate oxide film in thickness variations of the same degree as the surface of the silicon substrate with no Argon ions implanted therein.

Furthermore, the gate oxide films different in thickness are formed by once-thermal oxidation. Therefore, a process step for wet etching can be omitted as compared with a general manufacturing method. Thus, it is possible to eliminate a variation in the size of each device forming region in which the oxide film is removed by etching, and an influence exerted on transistor characteristics due to degradation in field oxide film.

This is particularly effective in forming gate oxide films different in thickness in a semiconductor wafer of an SOI structure or an SOS structure susceptible to the thickness of the field oxide film. A stable process can easily be designed as compared with a general manufacturing method which needs to design process steps while the remaining amount of field oxide film is being controlled.

Further, Argon ions are implanted only into the surface of the silicon substrate in the device forming region in which the thick-film gate oxide film is formed. It is thus possible to form the thick-film gate oxide film with no influence exerted on other device forming region.

Figure 4:
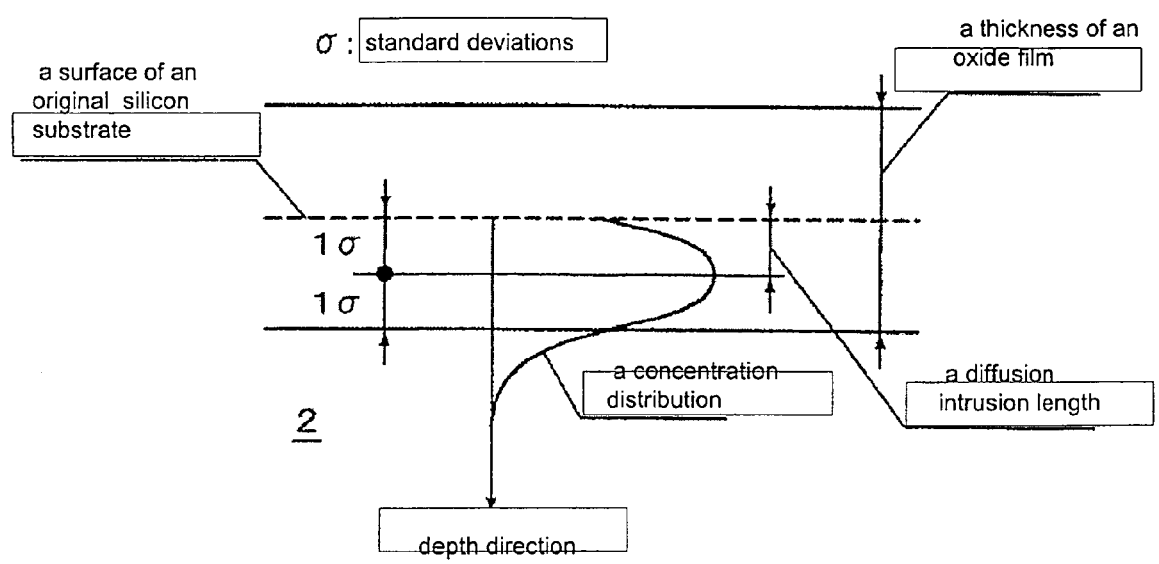
FIG. 4 is an explanatory view illustrating a method for setting a diffusional intrusion length, which is employed in the first embodiment.

Incidentally, all the spacing of the depth equal to half the forming predeterminate oxide film thickness may preferably be filled with peak±2σ as shown in FIG. 4 as to the layout or location of the concentration distribution of the oxidation-promoting element such as Argon. Since, however, the standard deviation σ of the concentration distribution is determined depending upon the state of the silicon substrate, the state of an ion implantation device, the environment around the semiconductor wafer, etc., the peak±2σ may be included in the spacing of the depth equal to half the forming predeterminate oxide film thickness.

Since the promoting action for the oxide film formation with the ion intrusion is set between the peak and the surface of the silicon substrate in this case, a skirt or hem of 2σ on the deep side may be disposed in matching with the depth equal to half the forming predeterminate oxide film thickness.

Second Preferred Embodiment

Figure 5:
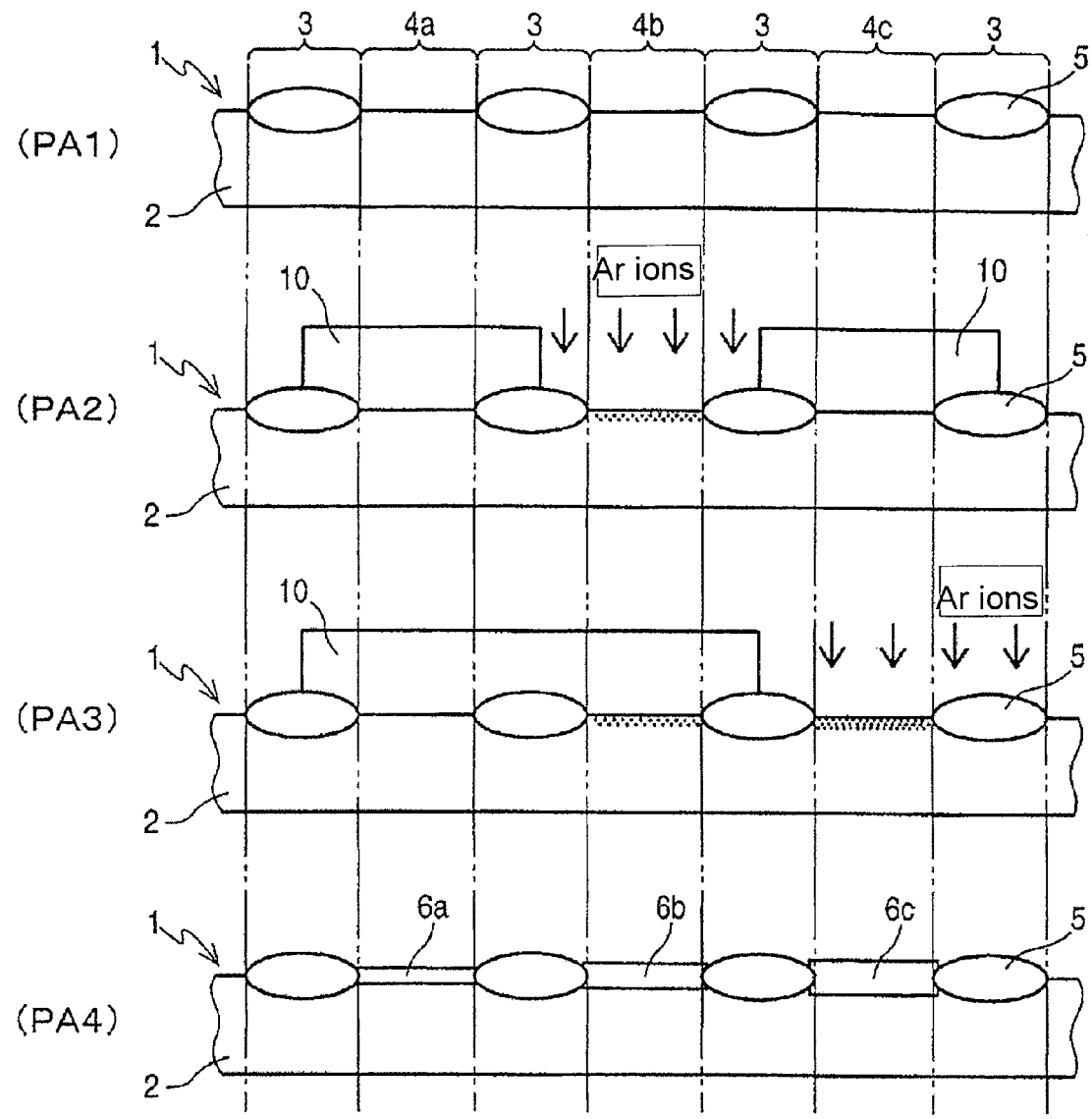
FIG. 5 is an explanatory view showing a method for manufacturing a semiconductor elemental device, according to a second embodiment.

FIG. 5 is an explanatory view showing a method for manufacturing a semiconductor elemental device, according to a second embodiment.

Incidentally, constituent elements similar to those employed in the first embodiment are given the same reference numerals, and their explanations will be omitted.

In FIG. 5, reference numeral 4c indicates a third device forming region, which is a region in which a second thick-film gate oxide film 6c (third gate oxide film) further thicker than a thick-film gate oxide film 6b (second gate oxide film) is formed.

The method for manufacturing the semiconductor elemental device, according to the present embodiment will hereinafter be explained in accordance with processes or process steps PA using FIG. 5.

In PA1, a field oxide film 5 is formed in a silicon substrate 2 in a manner similar to the process step P1 of the first embodiment to insulate and separate first, second and third device forming regions 4a, 4b and 4c from one another respectively.

In PA2, a resist mask 10, which covers a region excluding the second device forming region 4b in which a thick-film gate oxide film 6b is formed by photolithography, and a region excluding the field oxide film 5 located therearound, is formed. With the resist mask 10 as a mask, Argon ions are implanted into the exposed second device forming region 4b as a dose of $5\times10^{14}/cm^2$ at low implantation energy corresponding to an implantation energy of 7 keV or so.

In PA3, the resist mask 10 formed in the process step PA2 is removed using a release agent. A resist mask 10, which covers a region excluding the third device forming region 4c in which a second thick-film gate oxide film 6c is formed by photolithography, and a region excluding the field oxide film 5 located therearound, is formed again. With the resist mask 10 as a mask, Argon ions are implanted into the exposed third device forming region 4c as a dose of $10\times10^{14}/cm^2$ at low implantation energy corresponding to an implantation energy of 7 keV or so.

In PA4, the resist mask 10 formed in the process step PA3 is removed using a release agent. The first, second and third device forming regions 4a, 4b and 4c are thermally oxidized by a thermal oxidation method under conditions of 850° C. and 5 minutes to simultaneously form a thin-film gate oxide film 6a (first gate oxide film), a thick-film gate oxide film 6b (second gate oxide film) and the second thick-film gate oxide film 6c (third gate oxide film) in the first, second and third device forming regions 4a, 4b and 4c respectively.

Thereafter, a predetermined impurity for adjusting the threshold voltage of each MOSFET and its rated current is implanted in a manner similar to the normal manufacturing process, after which a gate electrode is formed to form a semiconductor elemental device based on the present embodiment.

As to the thicknesses of the thin-film gate oxide film 6a, thick-film gate oxide film 6b and second thick-film gate oxide film 6c formed in the process step PA4 referred to above, the thickness of the thin-film gate oxide film 6a formed in the first device forming region 4a with no Argon ions implanted therein results in approximately 48 angstroms as indicated by a mark x in FIG. 2. Further, the thickness of the thick-film gate oxide film 6b formed in the second device forming region 4b with Argon ions implanted therein results in about 55 angstroms as indicated by a mark ◇ in FIG. 2, and the thickness of the thick-film gate oxide film 6c formed in the third device forming region 4c results in about 62 angstroms as indicated by a mark ◇ in FIG. 2.

The settings of conditions for implanting Argon ions in the process steps PA2 and PA3 in this case may be determined every respective device forming regions, based on the method for setting the diffusional intrusion length, which has been described in the first embodiment.

In the present embodiment as described above, the three types of gate oxide films different in thickness can simultaneously be formed by once-thermal oxidation even in the case of the formation thereof in addition to an advantageous effect similar to the first embodiment. Even in the case of the formation of different gate oxide films of four type or more, they can simultaneously be formed in like manner.

Third Preferred Embodiment

Figure 6:
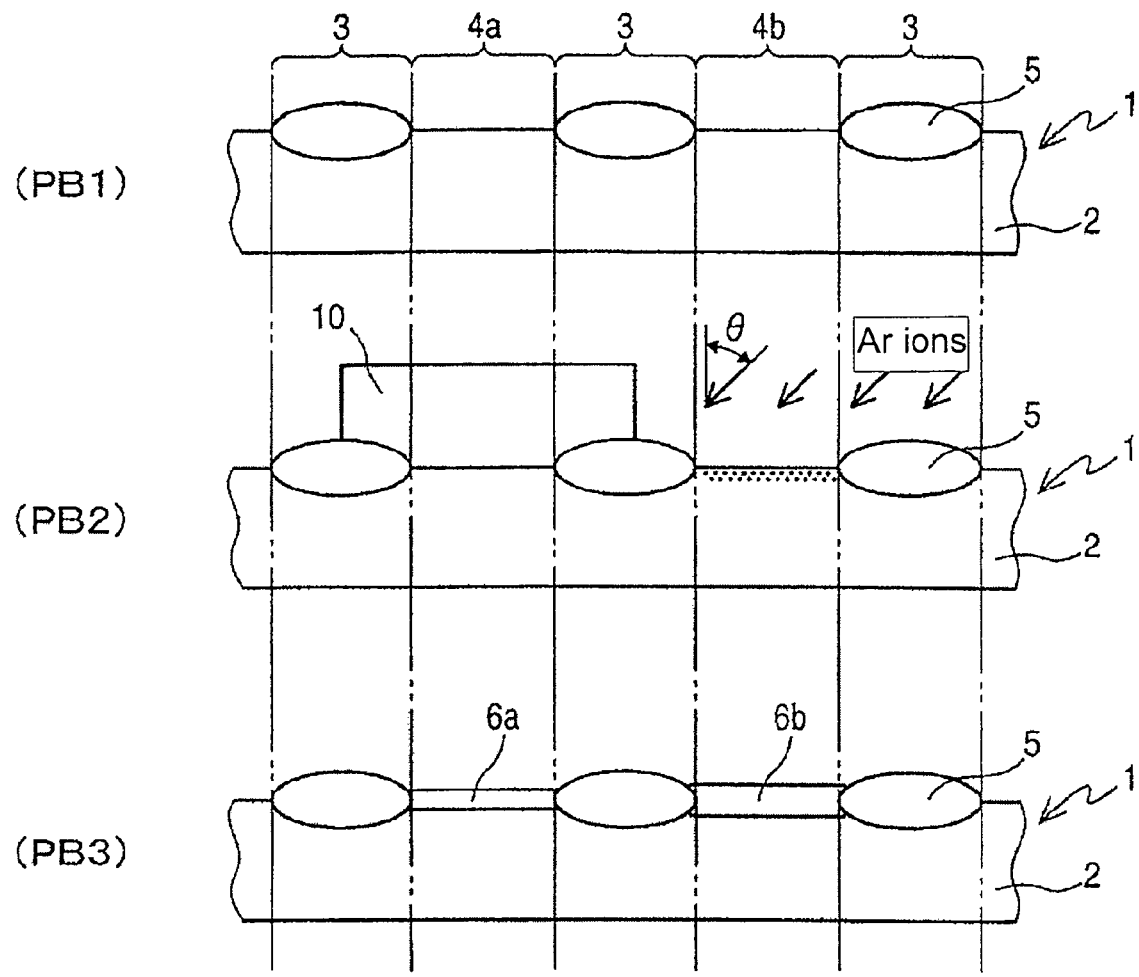
FIG. 6 is an explanatory view depicting a method for manufacturing a semiconductor elemental device, according to a third embodiment.

FIG. 6 is an explanatory view showing a method for manufacturing a semiconductor elemental device, according to a third embodiment.

Incidentally, constituent elements similar to those employed in the first embodiment are given the same reference numerals, and their explanations will be omitted.

A silicon substrate 2 of the present embodiment is similar in configuration to the first embodiment.

The method for manufacturing the semiconductor elemental device, according to the present embodiment will hereinafter be described in accordance with processes or process steps indicated by PB using FIG. 6.

In PB1, a field oxide film 5 is formed in the silicon substrate 2 in a manner similar to the process step P1 of the first embodiment to insulate and separate first and second device forming regions 4a and 4b from each other respectively.

In PB2, a resist mask 10, which covers the first device forming region 4a and the field oxide film 5 located therearound, is formed in a manner similar to the process step P2 of the first embodiment. Argon ions are implanted into the exposed second device forming region 4b obliquely at an implantation angle θ=45° as a dose of $5\times10^{14}/cm^2$ at low implantation energy corresponding to an implantation energy of 7 keV or so.

The implantation energy of 7 keV at this time is equivalent to 5 keV at the time that Argon ions are implanted in the direction (called simply "vertical direction") vertical to the surface of the silicon substrate 2 in the process step P2 of the first embodiment. That is, this is because since the implantation angle θ is 45°, implantation energy equivalent to about 1.4 times (1/cos θ times) a similar diffusional intrusion length is required if an attempt is made to obtain the similar diffusional intrusion length. Here, the implantation angle θ is equivalent to an angle measured from the vertical direction.

In PB3, thermal oxidation is carried out in a manner similar to the process step P3 of the first embodiment to simultaneously form a thin-film gate oxide film 6a (first gate oxide film) and a thick-film gate oxide film 6b (second gate oxide film) in the first and second device forming regions 4a and 4b respectively.

Thereafter, a predetermined impurity for adjusting the threshold voltage of each MOSFET and its rated current is implanted in a manner similar to the normal manufacturing process, after which a gate electrode is formed to form a semiconductor elemental device based on the present embodiment.

The thicknesses of the thin-film gate oxide film 6a and the thick-film gate oxide film 6b formed in the process step PB3 are similar to those in the process step P3 of the first embodiment. Since, however, Argon ions are obliquely implanted, they are implanted with their spread and a concentration distribution thereof in the surface layer of the silicon substrate 2 can be made dense, thereby making it possible to further enhance promoting action for oxide-film formation by Argon.

When this is compared with the case in which they are implanted in the vertical direction, a diffusional intrusion length becomes shallow in the case of the same dose and implantation energy. Hence this is effective in performing ion implantation at the shallow diffusional intrusion length.

When the same diffusional intrusion length is taken, implantation energy can be made great and processing time necessary for implantation can hence be shortened.

Incidentally, although the present embodiment has described the case in which the angle for implantation of Argon ions is 45°, the implantation angle is not limited to it and any angle may be taken. In brief, the implantation angle may suitably be fixed according to the relationship to a manufacturing device. If convenience of the device is allowed in this case, then the implantation angle may preferably be set to a deep angle (angle close to the horizon). Thus, the above effect can further be enhanced.

Figure 9:
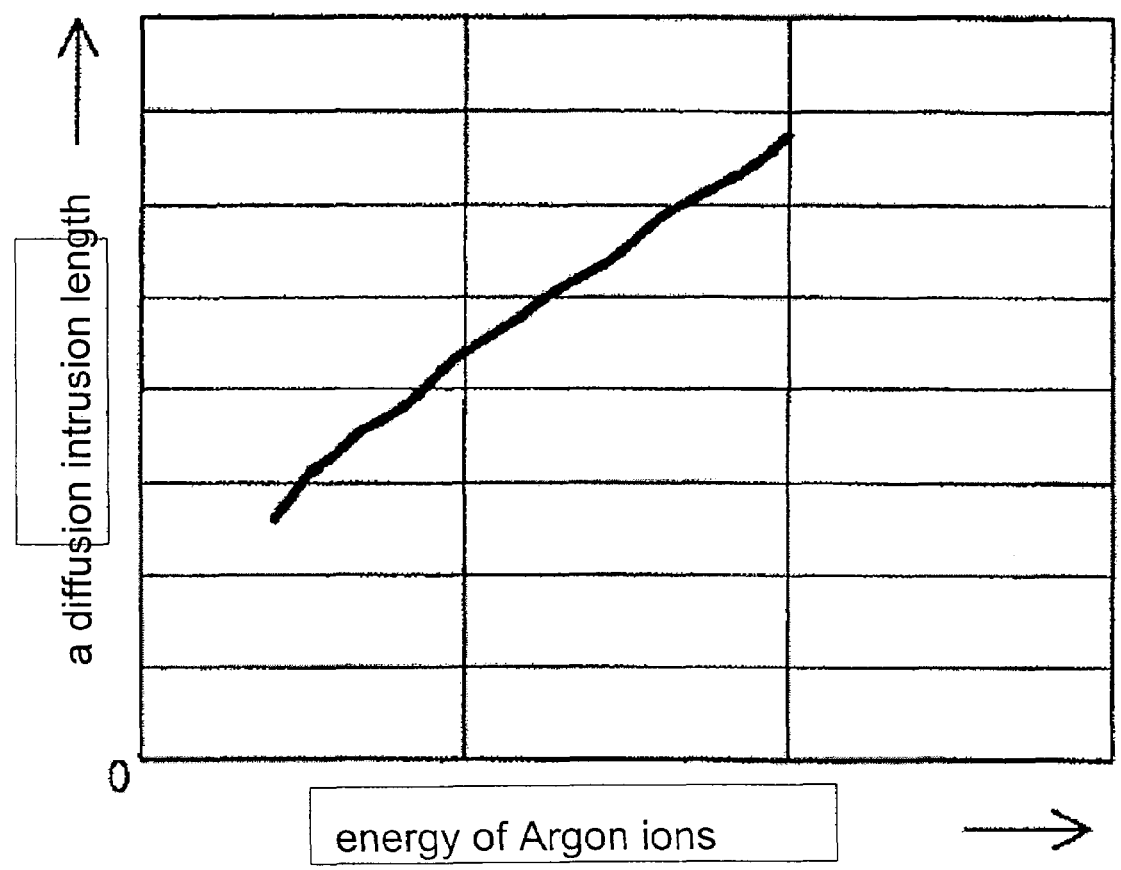
FIG. 9 is a graph illustrating a length of diffusion/intrusion of implantation energy into the silicon substrate.
Figure 10:
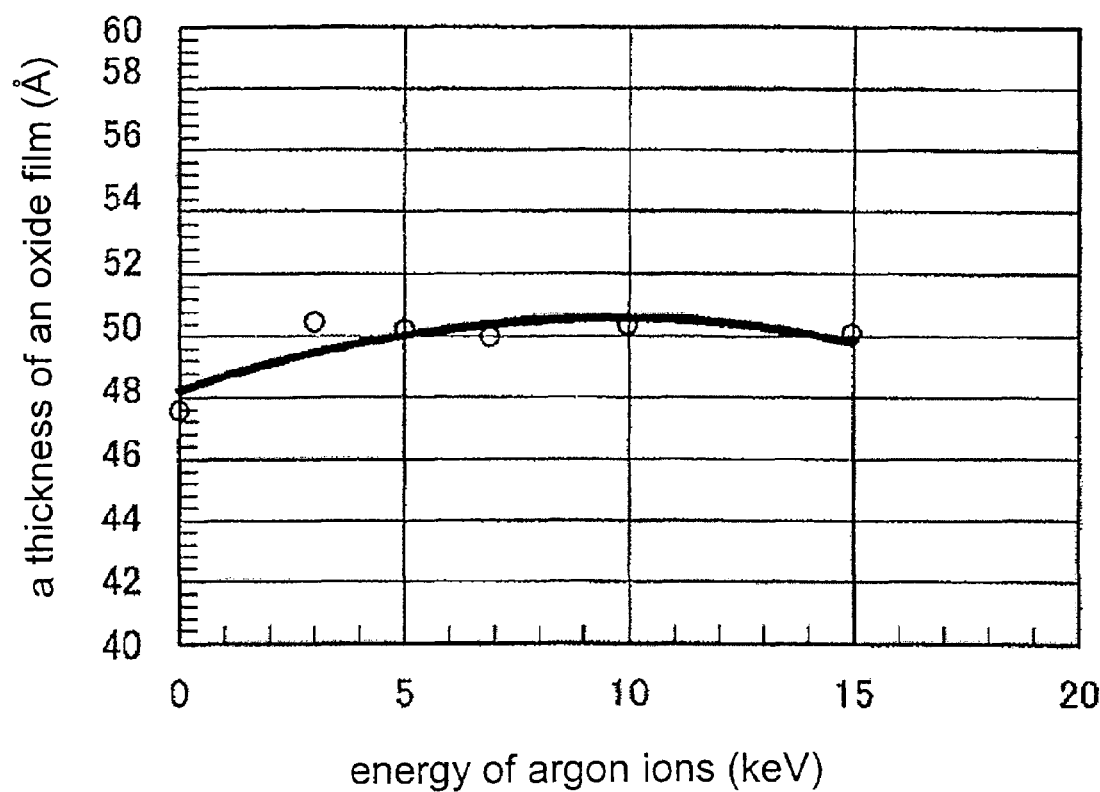
FIG. 10 is a graph showing an oxide film thickness formed according to implantation energy.

The setting of conditions for implanting Argon ions in the process step PB2 of the present embodiment may be performed according to the method for setting the diffusional intrusion length described in the first embodiment. That is, the diffusional intrusion length for forming the thick-film gate oxide film 6b is decided and multiplied by 1/cos θ on the basis of an implantation angle θ at which implantation energy determined using FIG. 9 is set, thereby obtaining actual implantation energy.

In the present embodiment as described above, the implantation energy can be made great by implanting Argon ions aslant in addition to an advantageous effect similar to the first embodiment. Further, processing time for implantation is shortened so that efficiency-enhancing of the manufacturing process of the semiconductor elemental device can further be achieved.

Incidentally, although each of the embodiments has explained the oxidation-promoting element as Argon used as an inert element, the oxidation-promoting element is not limited to the above. Oxygen (O), Krypton (Kr) and Xenon (Xe) each used as the inert element, etc. may be adopted. Since Krypton and Xenon or the like larger in mass than Argon are apt to lose energy in silicon in particular, such a concentration distribution that the concentration of the surface of the silicon substrate is made high can easily be formed and disposed, thereby making it possible to further enhance the promoting action for oxide-film formation.

Although each of the embodiments has explained, as an example, the semiconductor wafer constituted of one silicon substrate, a similar effect can be obtained if the present invention is applied to the silicon substrate for forming the semiconductor elemental device, even where the semiconductor wafer is configured in an SOI structure or an SOS structure.

While the preferred forms of the present invention have been described, it is to be understood that modifications will be apparent to those skilled in the art without departing from the spirit of the invention. The scope of the invention is to be determined solely by the following claims.

What is claimed is:

1. A method for manufacturing a semiconductor elemental device wherein a first gate oxide film and a second gate oxide film thicker than the first gate oxide film are formed on a substrate provided with a device forming region comprised of silicon, comprising the steps of:
    implanting an element for promoting a forming speed of said each gate oxide film into a region for forming the second gate oxide film of the substrate; and
    simultaneously forming the first gate oxide film and the second gate oxide film by a thermal oxidation method,
    wherein in said element implanting step, the element is implanted in space of a depth equal to half the thickness of the second gate oxide film placed in predetermination of its formation from the surface of the substrate in such a manner that with the peak of a concentration distribution of the element as the center, a concentration distribution in which both sides of the peak is given twice as large as a standard deviation of the concentration distribution, is taken.

2. The method according to claim 1, wherein a dose of the element is $5 \times 10^{13}/cm^2$ or more.

3. The method according to claim 1, wherein upon implantation of the element, the element is implanted into the substrate from a direction slanted to a direction vertical to the surface of the silicon substrate.

4. The method according to claim 1, wherein the element for promoting the forming speed of the gate oxide film is Argon.

* * * * *